United States Patent
Tromp

(10) Patent No.: US 11,237,236 B2
(45) Date of Patent: Feb. 1, 2022

(54) METHOD FOR DETERMINING A DERIVED PROPERTY OF A MEDIUM AND NUCLEAR MAGNETIC MEASURING DEVICE, COMPUTER PROGRAM PRODUCT AND COMPUTER-READABLE STORAGE MEDIUM FOR SUCH

(71) Applicant: KROHNE AG, Basel (CH)

(72) Inventor: Rutger Reinout Tromp, EM Dordrecht (NL)

(73) Assignee: KROHNE AG, Basel (CH)

( * ) Notice: Subject to any disclaimer, the term of this patent is extended or adjusted under 35 U.S.C. 154(b) by 0 days.

(21) Appl. No.: 17/024,141

(22) Filed: Sep. 17, 2020

(65) Prior Publication Data

US 2021/0080529 A1 Mar. 18, 2021

(30) Foreign Application Priority Data

Sep. 18, 2019 (DE) .................. 10 2019 125 121.4

(51) Int. Cl.
*G01R 33/44* (2006.01)
*G01R 33/31* (2006.01)
*G01N 24/08* (2006.01)

(52) U.S. Cl.
CPC ........... *G01R 33/448* (2013.01); *G01N 24/08* (2013.01); *G01R 33/31* (2013.01)

(58) Field of Classification Search
CPC ...... G01R 33/448; G01R 33/31; G01N 24/08; G01N 24/081; G01V 3/32; G01F 1/716
See application file for complete search history.

(56) References Cited

U.S. PATENT DOCUMENTS

| 2016/0076924 | A1* | 3/2016 | Pusiol | G01F 1/74 324/306 |
| 2016/0313159 | A1* | 10/2016 | Appel | G01F 1/74 |

* cited by examiner

*Primary Examiner* — G. M. A Hyder
(74) *Attorney, Agent, or Firm* — Whitmyer IP Group, LLC

(57) ABSTRACT

A method includes the steps of: introducing a medium with a first temperature into a measuring volume; carrying out nuclear magnetic measurements on the medium with the first temperature; determining a property of the medium at the first temperature; determining a viscosity of the medium at the first temperature using the property; and determining a derived property of the medium at a second temperature using the property of the medium at the first temperature, the viscosity of the medium at the first temperature, the first temperature, and the second temperature. The property is at least one of a first spin-lattice relaxation time constant, a first spin-spin relaxation time constant, and a first diffusion time constant. The derived property is at least one of a second spin-lattice relaxation time constant, a second spin-spin relaxation time constant, and a second diffusion time constant.

19 Claims, 2 Drawing Sheets

METHOD FOR DETERMINING A DERIVED PROPERTY OF A MEDIUM AND NUCLEAR MAGNETIC MEASURING DEVICE, COMPUTER PROGRAM PRODUCT AND COMPUTER-READABLE STORAGE MEDIUM FOR SUCH

TECHNICAL FIELD

The invention relates to a method for determining at least one derived property of a medium. For this purpose, a medium with a first temperature $\vartheta_1$ is introduced into a measuring volume, nuclear magnetic measurements are carried out on the medium with the first temperature in the measuring volume and at least one property of the medium at the first temperature is determined from the nuclear magnetic measurements from the group {spin-lattice relaxation time constant $T_1(\vartheta_1)$, spin-spin relaxation time constant $T_2(\vartheta_1)$ and diffusion time constant $D(\vartheta_1)$}.

Further, the invention relates to a nuclear magnetic flowmeter with a measuring tube, a measuring device and a computer, wherein the measuring tube has a measuring volume, the measuring device is designed to carry out nuclear magnetic measurements and the computer is designed to execute such a method.

Furthermore, the invention also relates to a computer program product and a computer-readable storage medium.

BACKGROUND

The invention lies in the field of nuclear magnetic measuring methods and nuclear magnetic flowmeters, wherein nuclear magnetic flowmeters are designed to implement nuclear magnetic measurements according to nuclear magnetic measuring methods.

A nuclear magnetic measuring device is thus designed to carry out nuclear magnetic measurements on a medium in the measuring volume of the measuring tube and to determine the properties of the medium and information about the medium from the nuclear magnetic measurements with the computer. When a nuclear magnetic measurement is carried out by the measuring device, a precession of atomic nuclei of the medium in the presence of a macroscopic magnetic field, which has previously magnetized the medium, is influenced by excitation of the atomic nuclei to nuclear magnetic resonances and the nuclear magnetic resonances are measured. The computer thereby controls the measuring device. For this reason, nuclear magnetic measurements are often also called nuclear magnetic resonance measurements or magnetic resonance measurements and corresponding measuring devices are called nuclear magnetic resonance measuring devices or magnetic resonance measuring devices. The measuring device has a magnetic field generating device for generating the macroscopic magnetic field.

The medium often also has several phases. It is then a multi-phase medium. In order to determine the properties of and/or information about the individual phases of the multi-phase medium, atomic nuclei of the individual phases have to be able to be excited to distinguishable nuclear magnetic resonances. For example, nuclear magnetic resonances can be distinguished from each other if spin-lattice relaxations of the individual phases have different spin-lattice relaxation time constants $T_1$. The spin-lattice relaxation time constant is a property of a phase. Further properties are a spin-spin relaxation time constant $T_2$ and a diffusion time constant $D$. Using at least one of the listed properties, information about phases of the medium can be determined. Information is, for example, the flow rates of individual phases of the medium through the measuring tube.

Since the multi-phase medium extracted from oil wells essentially comprises crude oil and (salt) water as liquid phases and natural gas as gaseous phase, the atomic nuclei of all phases have hydrogen nuclei and usually especially the phases crude oil and (salt) water are characterized by different spin-lattice relaxation time constants $T_1$, nuclear magnetic flowmeters are particularly suitable for the determination of properties and information of media extracted from oil wells.

As already mentioned above, a medium with a first temperature $\vartheta_1$ is introduced into a measuring volume. The measuring volume is formed in a measuring tube, for example, and the medium is introduced into the measuring volume by flowing through the measuring tube. The medium has the first temperature. It consists of one or more phases. The phases are either liquid or gaseous. Nuclear magnetic measurements are carried out on the medium, which has the first temperature and is in the measuring volume. At least one property of the medium at the first temperature is determined from the measurements. The at least one property is a property from the group {spin-lattice relaxation time constant $T_1(\vartheta_1)$, spin-spin relaxation time constant $T_2(\vartheta_1)$ and diffusion time constant $D(\vartheta_1)$}. Consequently, a spin-lattice relaxation time constant $T_1(\vartheta_1)$ and/or a spin-spin relaxation time constant $T_2(\vartheta_1)$ and/or a diffusion time constant $D(\vartheta_1)$ is determined. If the medium is a multi-phase medium, then at least one property of at least one phase of the medium is determined.

The group of properties of a medium listed above is dependent on the temperature $\vartheta$ of the medium. Consequently, the values of the properties at a second temperature $\vartheta_2$ differ from those at the first temperature $\vartheta_1$, wherein the second temperature is different from the first temperature. It is known from the state of the art to determine the properties of the medium at the second temperature by carrying out the above described measurements and dew scribed determination of the properties from the measurements again on the medium at the second temperature. However, this method is time consuming.

SUMMARY

Thus, the object of the invention is to provide a method which requires less time than the known method.

The object is achieved by a method with the disclosed features. First, a viscosity $\eta(\vartheta_1)$ of the medium at the first temperature $(\vartheta_1)$ is determined from the previously determined at least one property. Then, at least one derived property of the medium at a second temperature $(\vartheta_2)$ from the group {spin-lattice relaxation time constant $T_1(\vartheta_2)$, spin-spin relaxation time constant $T_2(\vartheta_2)$ and diffusion time constant $D(\vartheta_2)$} is determined using the at least one property of the medium at the first temperature, the previously determined viscosity $\eta(\vartheta_1)$ of the medium at the first temperature, the first temperature $(\vartheta_1)$ and the second temperature $(\vartheta_2)$. Preferably, the at least one derived property of the medium is also indicated.

The at least one property from which the viscosity of the medium at the first temperature is determined is a previously determined property of the medium at the first temperature from the group {spin-lattice relaxation time constant $T_1(\vartheta_1)$, spin-spin relaxation time constant $T_2(\vartheta_1)$ and diffusion time constant $D(\vartheta_1)$}. By determining a property of the medium at the second temperature from the group {spin-lattice relaxation time constant $T_1(\vartheta_2)$, spin-spin relaxation time constant $T_2(\vartheta_2)$ and diffusion time constant $D(\vartheta_2)$} using the at least one property of the medium at the first temperature, this property of the medium at the second temperature becomes a derived property. Preferably, the property of the medium at the second temperature is determined using this property of the medium at the first temperature. For example, the spin-lattice relaxation time constant of the medium at the second temperature is determined using the spin-lattice relaxation time constant of the medium at the first temperature.

Compared to the state of the art, this method requires less time. A time-consuming carrying out of measurements, from which the properties of the medium are determined again at the second temperature of the medium as at the first temperature of the medium, is no longer necessary, resulting in a lower time requirement. Instead, the properties of the medium at the second temperature are derived from those at the first temperature.

The viscosity of the medium $\eta(\vartheta_1)$ at the first temperature can be determined according to different configurations of the method according to the invention.

In a first design of the determination of the viscosity $\eta(\vartheta_1)$ of the medium at the first temperature, the spin-lattice relaxation time constant $T_1(\vartheta_1)$ of the medium at the first temperature is first determined as the at least one property. In addition, other properties of the medium are preferably determined at the first temperature. Then a logarithmic average or a weighted average of the spin-lattice relaxation time constant $T_{1,LM}(\vartheta_1)$ is determined. Further, the viscosity $\eta(\vartheta_1)$ of the medium at the first temperature is determined from the logarithmic average or the weighted average of the spin-lattice relaxation time constant using the first formula $$T_{1,LM}(\vartheta_1) \approx k_1(\eta(\vartheta_1))^{-k_2} + k_3(\eta(\vartheta_1))^{k_4}.$$

The formula has four parameters, namely $k_1$, $k_2$, $k_3$ and $k_4$, wherein the values of the parameters are real numbers. The parameters are assigned values from the ranges $0.37831 \leq k_1 \leq 3.3887$, $0.45419 \leq k_2 \leq 1.2055$, $0.88616 \cdot 10^{-3} \leq k_3 \leq 26.547 \cdot 10^{-3}$ and $-0.023116 \leq k_4 \leq 0.34519$.

The determination of the viscosity $\eta(\vartheta_1)$ is more accurate if the parameters are assigned values from the narrower ranges $0.75655 \leq k_1 \leq 2.2618$, $0.63180 \leq k_2 \leq 1.0075$, $1.7727 \cdot 10^{-3} \leq k_3 \leq 14.603 \cdot 10^{-3}$ and $0.10966 \leq k_4 \leq 0.29381$.

The determination of the viscosity $\eta(\vartheta_1)$ is even more accurate if the values $k_1=1.1348$, $k_2=0.80942$, $k_3=2.6592 \cdot 10^{-3}$ and $k_4=0.24243$ are assigned to the parameters.

In a second design of the determination of viscosity $\eta(\vartheta_1)$, first the spin-spin relaxation time constant $T_2(\vartheta_1)$ of the medium at the first temperature is determined as the at least one property. In addition, other properties of the medium are preferably determined at the first temperature. Then a logarithmic average or a weighted average of the spin-spin relaxation time constant $T_{2,LM}(\vartheta_1)$ is determined. Further, the viscosity $\eta(\vartheta_1)$ of the medium at the first temperature is determined from the logarithmic average or the weighted average of the spin-spin relaxation time constant using the second formula $$T_{2,LM}(\vartheta_1) \approx k_5(\eta(\vartheta_1))^{-k_6}.$$

The formula has two parameters, $k_5$ and $k_6$, wherein the values of the parameters are real numbers. The parameters are assigned values from the ranges $0.37831 \leq k_5 \leq 3.3887$ and $0.45419 \leq k_6 \leq 1.2055$.

The determination of the viscosity $\eta(\vartheta_1)$ is more accurate if the parameters are assigned values from the narrower ranges $0.75655 \leq k_5 \leq 2.2618$ and $0.63180 \leq k_6 \leq 1.0075$.

The determination of the viscosity $\eta(\vartheta_1)$ is even more accurate if the parameters are assigned the values $k_5=1.1348$ and $k_6=0.80942$.

In a third design of the determination of the viscosity $\eta(\vartheta_1)$, first the diffusion time constant $D(\vartheta_1)$ of the medium at the first temperature is determined as the at least one property. In addition, other properties of the medium are preferably determined at the first temperature. Then the viscosity is calculated from the diffusion time constant $D(\vartheta_1)$ using the third formula $$D(\vartheta_1) = k_7 \eta(\vartheta_1)^{-k_8}.$$

The formula has two parameters, $k_7$ and $k_8$, wherein the values of the parameters are real numbers. The values assigned to the parameters depend on the value of the diffusion time constant $D(\vartheta_1)$.

If the diffusion time constant $D(\vartheta_1)$ of the medium at the first temperature is less than or equal to $3 \cdot 10^{-11}$ m$^2$/s, then the following applies:

The parameters are assigned values from the ranges $0.2445 \cdot 10^{-9} \leq k_7 \leq 2.2005 \cdot 10^{-9}$ and $0.375 \leq k_8 \leq 0.650$.

The determination of the viscosity $\eta(\vartheta_1)$ is more accurate when the parameters are assigned values from the narrower ranges $0.48900 \cdot 10^{-9} \leq k_7 \leq 1.4670 \cdot 10^{-9}$ and $0.43750 \leq k_8 \leq 0.57500$.

The determination of the viscosity $\eta(\vartheta_1)$ is even more accurate when the parameters are assigned the values $k_7=0.7335 \cdot 10^{-9}$ and $k_8=0.500$.

If the diffusion time constant $D(\vartheta_1)$ of the medium at the first temperature is greater than $3 \cdot 10^{-11}$ m$^2$/s, then the following applies:

The parameters are assigned values from the ranges $0.05777 \cdot 10^{-9} \leq k_7 \leq 0.5199 \cdot 10^{-9}$ and $0.125 \leq k_8 \leq 0.375$.

The determination of the viscosity $\eta(\vartheta_1)$ is more accurate when the parameters are assigned values from the narrower ranges $0.11554 \cdot 10^{-9} \leq k_7 \leq 0.34660 \cdot 10^{-9}$ and $0.18750 \leq k_8 \leq 0.31250$.

The determination of the viscosity $\eta(\vartheta_1)$ is even more accurate when the parameters are assigned the values $k_7=0.1733 \cdot 10^{-9}$ and $k_8=0.25$.

In a further design of the method according to the invention, at least one relaxation time constant $T_i(\vartheta_2)$, $i=\{1,2\}$ of the medium at the second temperature from the group {spin-lattice relaxation time constant $T_1(\vartheta_2)$ and spin-spin relaxation time constant $T_2(\vartheta_2)$} using a temperature coefficient $dT_i/d\vartheta$ of a relaxation time constant $T_i$ from the group {spin-lattice relaxation time constant $T_1$ and spin-spin relaxation time constant $T_2$} as the at least one derived property. The temperature coefficient is given as an example.

Preferably, the at least one relaxation time constant $T_i(\vartheta_2)$, $i=\{1,2\}$ of the medium at the second temperature is determined using the temperature coefficient $dT_i/d\vartheta$, of this relaxation time constant. For example, the spin-lattice relaxation time constant $T_2(\vartheta_2)$ of the medium at the second temperature is determined using the temperature coefficient $dT_2/d\vartheta$ of the spin-lattice relaxation time constant.

In a further development of the above design, the at least one relaxation time constant $T_i(\vartheta_2)$, $i=\{1,2\}$ of the medium at the second temperature is determined using the fourth formula $$T_i(\vartheta_2) = T_i(\vartheta_1) e^{\gamma \vartheta_2}.$$

In an alternative to the above further development, the at least one relaxation time constant $T_i(\vartheta_2)$, $i=\{1,2\}$ is determined using the Taylor polynomial according to the fifth formula $$T_i(\vartheta_2) = T_i(\vartheta_1)[1 + \gamma(\vartheta_2 - \vartheta_1) + \ldots].$$

The Taylor polynomial is a Taylor polynomial of the fourth formula. Preferably the Taylor polynomial is a second- or third-degree polynomial.

In another alternative, the at least one relaxation time constant is determined using the approximation formula according to the sixth formula $$T_i(\vartheta_2) \approx T_i(\vartheta_1) + \frac{dT_i}{d\vartheta}(\vartheta_2 - \vartheta_1).$$

The approximation formula is an approximation of the fourth formula.

In the above formulas, the seventh formula is used $$\gamma = \frac{1}{T_i(\vartheta_1)} \frac{dT_i}{d\vartheta}.$$

If a temperature coefficient $dT_i/d\vartheta$, $T_i=\{1,2\}$ is used according to the above explanations, then in a further formulation it is provided that the temperature coefficient $dT_i/d\vartheta$ is determined using the eighth formula $$\frac{dT_i}{d\vartheta} \approx k_9 e^{-k_{10}\eta}.$$

The formula has two parameters, $k_9$ and $k_{10}$, wherein the values of the parameters are real numbers. The parameters are assigned values from the ranges $0.013036 \leq k_9 \leq 0.11732$ and $1.2604 \cdot 10^{-3} \leq k_{10} \leq 5.0416 \cdot 10^{-3}$.

The determination of viscosity $T_1(\vartheta_1)$ is more accurate when the parameters are assigned values from the narrower ranges $0.026072 \leq k_9 \leq 0.078213$ and $1.8906 \cdot 10^{-3} \leq k_{10} \leq 3.7812 \cdot 10^{-3}$.

The determination of the viscosity $\eta(\vartheta_1)$ is even more accurate when the parameters are assigned the values $k_9 = 0.039107$ and $k_{10} = 2.5208 \cdot 10^{-3}$.

In a further development of the above design, it is provided that the viscosity $\eta(\vartheta 1)$ of the medium at the first temperature is used.

If, according to the above, the spin-lattice relaxation time constant $T_1(\vartheta_2)$ is determined at the second temperature of the medium, then a further design of the method provides that first a logarithmic average or a weighted average of the spin-lattice relaxation time constant $T_{1,LM}(\vartheta_2)$ is determined. It is further provided that the viscosity $\eta(\vartheta_2)$ of the medium at the second temperature is determined from the logarithmic average or the weighted average of the spin-lattice relaxation time constant $T_{1,LM}(\vartheta_2)$ using the first formula. The parameters in the first formula are assigned values from the listed ranges. The explanations regarding the values also apply here.

If, according to the above explanations, the spin-spin relaxation time constant $T_2(\vartheta_2)$ is determined at the second temperature of the medium, then a further design of the method provides that first a logarithmic average or a weighted average of the spin-spin relaxation time constant $T_{2,LM}(\vartheta_2)$ is determined. It is further provided that the viscosity $\eta(\vartheta_2)$ of the medium at the second temperature is determined from the logarithmic average or the weighted average of the spin-spin relaxation time constant $T_{2,LM}(\vartheta_2)$ using the second formula. The parameters in the second formula are assigned values from the listed ranges. The explanations regarding the values also apply here.

If, for example, the viscosity $\eta(\vartheta_2)$ of the medium at the second temperature is determined according to one of the two above designs, it is provided in a further development that the diffusion time constant $D(\vartheta_2)$ of the medium at the second temperature is determined from the viscosity $\eta(\vartheta_2)$ of the medium at the second temperature using the third formula. The parameters in the third formula are assigned values from the listed ranges. The explanations regarding the values also apply here.

In a further design, the method is supplemented in the functional range. Namely, the medium with the second temperature $\vartheta_2$ flows through the measuring volume. Accordingly, the medium no longer has the first temperature $\vartheta_1$, but the second temperature $\vartheta_2$. With the nuclear magnetic flowmeter, it flows through the measuring volume in the measuring tube. Nuclear magnetic measurements are then carried out on the medium with the second temperature in the measuring volume. Then, a flow rate of the medium with the second temperature through the measuring volume is determined using the nuclear magnetic measurements on the medium with the second temperature, the spin-lattice relaxation time constant $T_1(\vartheta_2)$ and/or the spin-spin relaxation time constant $T_2(\vartheta_2)$ of the medium at the second temperature. The flow rate is a piece of information about the medium. The spin-lattice relaxation time constant $T_1(\vartheta_2)$ and the spin-spin relaxation time constant $T_2(\vartheta_2)$ are determined as derived properties of the medium according to the above explanations.

Although the medium now has the second temperature $\vartheta_2$ different from the first temperature $\vartheta_1$ and the values of the properties of the medium, including in particular the viscosity $\eta$, the spin-lattice relaxation time constant $T_1$, the spin-spin relaxation time constant $T_2$ and the density $\rho$, have changed due to the change in temperature $\Delta\vartheta = \vartheta_2 - \vartheta_1$, it is possible to determine the flow rate because the properties of the medium at the second temperature ($\eta(\vartheta_2)$, $T_1(\vartheta_2)$, $T_2(\vartheta_2)$, $\rho(\vartheta_2)$) are derived from the properties of the medium at the first temperature ($\eta(\vartheta_1)$, $T_1(\vartheta_1)$, $T_2(\vartheta_1)$, $\rho(\vartheta_1)$). A time-consuming carrying out of measurements, from which the properties of the medium are determined again at the second temperature of the medium as at the first temperature of the medium, is no longer necessary, resulting in a shorter time requirement.

In a further development of the above design it is provided that the flow rate of the medium with the second temperature $\vartheta_2$ is converted to a flow rate of the medium at the first temperature $\vartheta_1$ or a further temperature $\vartheta_3$. In different applications the requirement is given to indicate the flow rate standardized to certain characteristics of the medium. For example, there is a requirement to specify the flow rate of the medium normalized to the first temperature $\vartheta_1$ or another temperature $\vartheta_3$, although the flow rate was measured at the temperature $\vartheta_2$. This standardization makes it possible to compare flow rates measured at different temperatures.

In a further development of the above further development, the density $\rho$ and/or the viscosity $\eta$ of the medium is or are used for this conversion. For example, the conversion is made according to the black oil standard API 2540 from 1984.

The above designs and further developments describe the determination of the viscosity of the medium at the first temperature and the determination of at least one derived property of the medium at the second temperature. In a further design of the method, the functional scope of the method is supplemented by determining a density ρ of the medium from the viscosity η of the medium.

In a further development, it is provided that the density is determined from the viscosity using the formula $$\rho \approx k_{11} - \frac{k_{12}}{\eta^{k_{13}}}.$$

Accordingly, the density, which is also a property of the medium, is derived from another quantity, namely viscosity, which is why no separate measurement of the density with a measuring device designed for this purpose is necessary. Correspondingly, the costs for this measuring device are also omitted.

The formula has three parameters, namely $k_{11}$, $k_{12}$ and $k_{13}$, wherein the values of the parameters are real numbers. The parameters are assigned values from the ranges $941.82 \leq k_{11} \leq 1025.8$, $180.65 \leq k_{12} \leq 264.61$ and $0.15921 \leq k_{13} \leq 0.37899$.

The determination of the density ρ is more accurate when the parameters are assigned values from the narrower ranges $962.81 \leq k_{11} \leq 1004.8$, $201.64 \leq k_{12} \leq 243.62$ and $0.21415 \leq k_{13} \leq 0.32405$.

The determination of the density is even more accurate when the parameters are assigned the values $k_{11} = 983.80$, $k_{12} = 222.63$ and $k_{13} = 0.26910$.

The invention also concerns, as has already been described, a nuclear magnetic flowmeter. The described object is also achieved by a nuclear magnetic flowmeter with the disclosed features. The computer is designed to carry out the described method. Preferably, the electromagnetic flowmeter also has a display device which is designed to indicate at least one derived property of the medium.

Furthermore, the object is also achieved by a computer program product with the disclosed features, which comprises instructions which, when the program is executed by a computer, cause the computer to carry out the described method.

The object is also achieved by a computer-readable storage medium with the disclosed features, which comprises instructions which, when the program is executed by a computer, cause the computer to carry out the described method.

DESCRIPTION OF THE DRAWINGS

In detail, there is a plurality of possibilities for designing and further developing the method, the nuclear magnetic flowmeter, the computer program product and the computer-readable storage medium. For this, reference is made to the following description of preferred embodiments in connection with the drawings.

DETAILED DESCRIPTION

Figure 1:
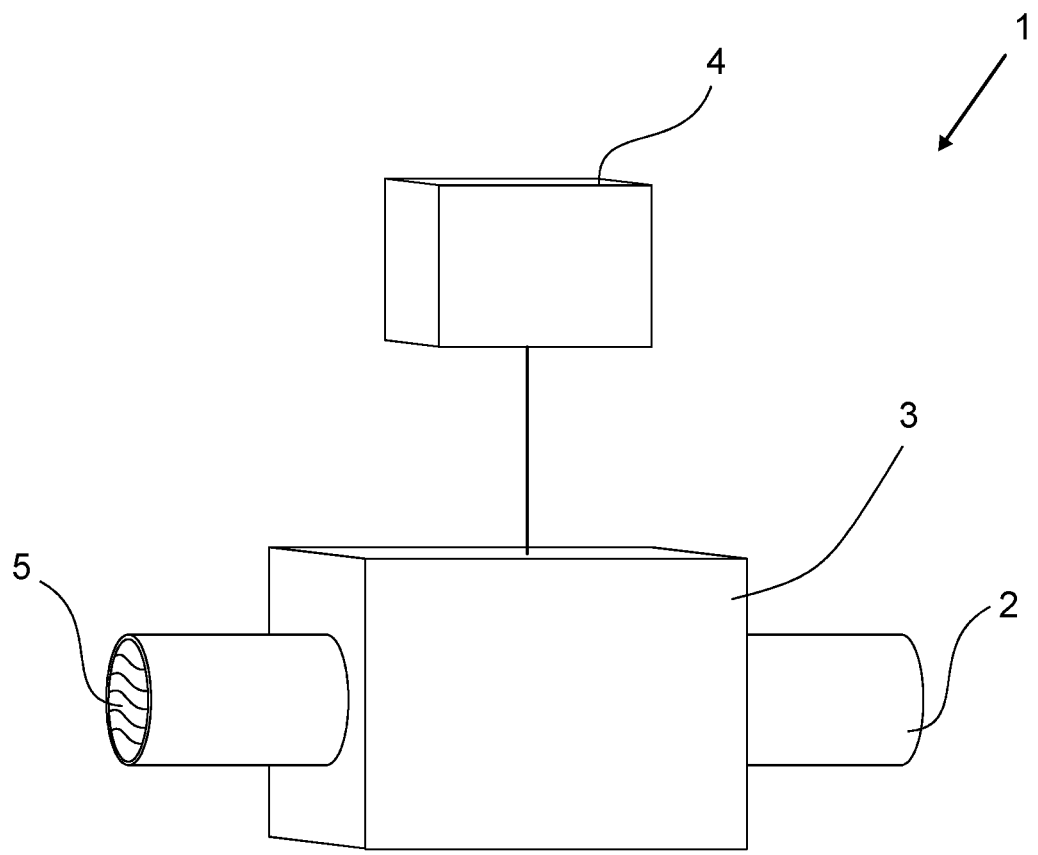
FIG. 1 illustrates a first embodiment of a nuclear magnetic flowmeter.

FIG. 1 shows an embodiment of a nuclear magnetic flowmeter 1, comprising a measuring tube 2 with a measuring volume, a measuring device 3 and a computer 4. The measuring device 3 is designed to carry out nuclear magnetic measurements. During operation of the nuclear magnetic flowmeter 1, a medium 5 flows through the measuring tube 2 and the computer 4 carries out the method described below, wherein the computer 4 also controls the measuring device 3 and the measuring device carries out nuclear magnetic measurements on the medium 5 in the measuring volume. The method is stored as a program on a storage medium readable by the computer 4 and is read into the computer 4 by the computer 4 when operation is started and comprises commands which cause the computer 4 to execute the method.

Figure 2:
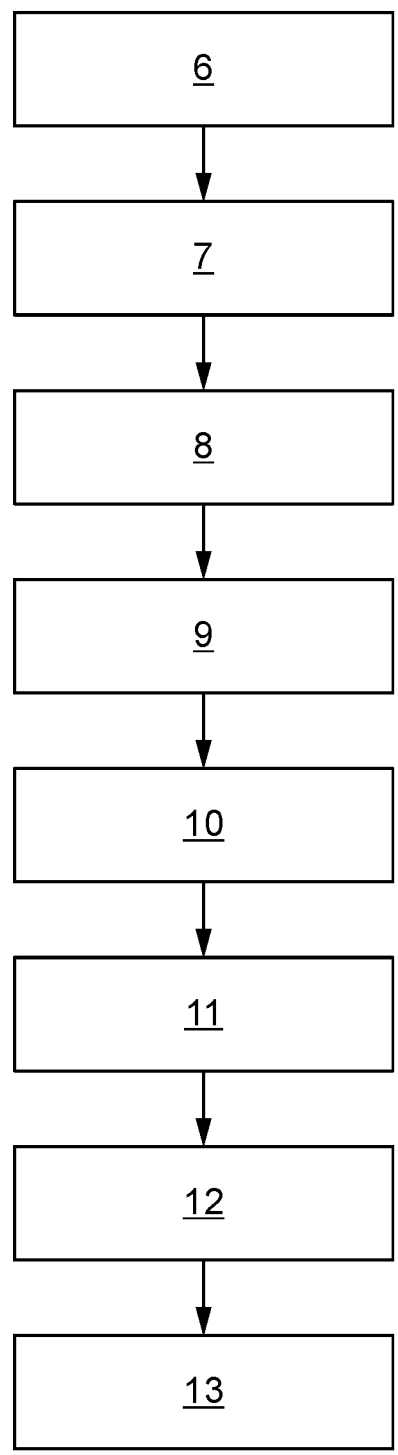
FIG. 2 illustrates a flow chart of an embodiment of a method for the determination of a derived property of a medium.

Referring to FIG. 2, in a first method step 6, the medium 5 has a first temperature $\vartheta_1$ and is introduced into the measuring volume by flowing through the measuring tube 2.

In a second method step 7, nuclear magnetic measurements are carried out on the medium 5 in the measuring volume. The medium 5 has the first temperature $\vartheta 1$ during the measurements.

In a third method step 8, a spin-lattice relaxation time constant $T_1(\vartheta_1)$ is determined from the nuclear magnetic measurements as a property of the medium at the first temperature $\vartheta_1$.

In a fourth step 9, a viscosity $\eta(\vartheta_1)$ of the medium 5 at the first temperature $\vartheta_1$ is determined from the spin-lattice relaxation time constant $T_1(\vartheta_1)$.

The viscosity $\eta(\vartheta_1)$ is determined by first determining a logarithmic average of the spin-lattice relaxation time constant $T_{1,LM}(\vartheta_1)$. Then the viscosity $\eta(\vartheta_1)$ is determined from the logarithmic average of the spin-lattice relaxation time constant $T_{1,LM}(\vartheta_1)$ using the first formula $$T_{1,LM}(\vartheta_1) \approx k_1(\eta(\vartheta_1))^{-k_2} + k_3(\eta(\vartheta_1))^{k_4}.$$

Here, $k_1 = 1.1348$, $k_2 = 0.80942$, $k_3 = 2.6592 \cdot 10^{-3}$ and $k_4 = 0.24243$.

In a fifth method step 10, the spin-lattice relaxation time constant $T_1(\vartheta_2)$ of the medium 5 at a second temperature $\vartheta_2$ is determined as a derived property using the spin-lattice relaxation time constant $T_1(\vartheta_1)$ of the medium at the first temperature $\vartheta_1$, the viscosity $\eta(\vartheta_1)$ of the medium at the first temperature $\vartheta_1$, the first temperature $\vartheta_1$ and the second temperature $\vartheta_2$.

The determination of the spin-lattice relaxation time constant $T_1(\vartheta_2)$ at the second temperature $\vartheta_2$ is carried out using the approximate formula $$T_i(\vartheta_2) \approx T_i(\vartheta_1) + \frac{dT_i}{d\vartheta}(\vartheta_2 - \vartheta_1)$$

In the approximation formula a temperature coefficient $dT_1/d\vartheta$ of the spin-lattice relaxation time constant $T_1$ is used. The temperature coefficient is determined using the formula $$\frac{dT_i}{d\vartheta} \approx k_9 e^{-k_{10}\eta}.$$

In this, $k_9 = 0.039107$ and $k_{10} = 2.5208 \cdot 10^{-3}$. The viscosity η is used as viscosity $\eta(\vartheta_1)$ at the first temperature $\vartheta_1$.

Although only nuclear magnetic measurements on the medium 5 with the first temperature $\vartheta_1$ were carried out in the previously described method steps, the spin-lattice relaxation time constant $T_1(\vartheta_2)$ could be determined at the second temperature $\vartheta_2$. A time-consuming carrying out of nuclear magnetic measurements, from which the spin-lattice relaxation time constant $T_1(\vartheta_2)$ of the medium 5 is determined again at the second temperature $\vartheta 2$ of the medium 5 as at the first temperature of the medium, is no longer necessary, resulting in a shorter time requirement. Instead, the spin-lattice relaxation time constant $T_1(\vartheta_2)$ at the second temperature of medium 5 is derived from that at the first temperature $\vartheta_1$.

In a supplement to the method, the following method steps are also carried out:

In a sixth method step 11, the medium 5 has a second temperature $\vartheta_2$ and is introduced into the measuring volume by flowing through the measuring tube 2.

In a seventh method step 12, nuclear magnetic measurements are performed on the medium 5 in the measuring volume. The medium 5 has the second temperature $\vartheta_2$ during the measurements.

In an eighth method step 13, a flow rate of the medium 5 with the second temperature $\vartheta_2$ is determined through the measuring tube 2 using the nuclear magnetic measurements performed in the previous method step and the previously determined spin-lattice relaxation time constant $T_1(\vartheta_2)$ of the medium 5 at the second temperature $\vartheta_2$.

Although the medium 5 now has the second temperature $\vartheta_2$ different from the first temperature $\vartheta_1$ and the value of the spin-lattice relaxation time constant $T_1$ has changed due to the temperature change $\Delta\vartheta=\vartheta_2-\vartheta_1$, the determination of the flow rate of the medium 5 through the measuring tube 2 is possible because the spin-lattice relaxation time constant $T_1(\vartheta_2)$ at the second temperature $\vartheta_2$ of the medium 5 has been derived from spin-lattice relaxation time constant $T_1(\vartheta_1)$ of the medium 5 at the first temperature $\vartheta_1$. A time-consuming carrying out of nuclear magnetic measurements, from which the spin-lattice relaxation time constant $T_1(\vartheta_2)$ of the medium 5 is again determined at the second temperature $\vartheta_2$ of medium 5 as at the first temperature $\vartheta_1$ of the medium 5, is no longer necessary, resulting in a reduced time requirement.

The invention claimed is:

1. A method for the determination of at least one derived property of a medium, comprising:
    introducing a medium with a first temperature ($\vartheta_1$) into a measuring volume;
    carrying out nuclear magnetic measurements on the medium with the first temperature ($\vartheta_1$) in the measuring volume;
    determining at least one property of the medium at the first temperature ($\vartheta_1$) from the nuclear magnetic measurements, the at least one property being at least one of a first spin-lattice relaxation time constant ($T_1(\vartheta_1)$), a first spin-spin relaxation time constant ($T_2(\vartheta_1)$), and a first diffusion time constant ($D(\vartheta_1)$);
    determining a viscosity ($\eta(\vartheta_1)$) of the medium at the first temperature ($\vartheta_1$) from the at least one property; and
    determining at least one derived property of the medium at a second temperature ($\vartheta_2$) using the at least one property of the medium at the first temperature ($\vartheta_1$), the viscosity ($\eta(\vartheta_1)$) of the medium at the first temperature, the first temperature ($\vartheta_1$), and the second temperature ($\vartheta_2$), the at least one derived property being at least one of a second spin-lattice relaxation time constant ($T_1(\vartheta_2)$), a second spin-spin relaxation time constant ($T_2(\vartheta_2)$), and a second diffusion time constant ($D(\vartheta_2)$).

2. The method according to claim 1, wherein the first spin-lattice relaxation time constant ($T_1(\vartheta_1)$) of the medium (5) at the first temperature ($\vartheta_1$) is determined as the at least one property;
    wherein the method further comprises:
    determining a logarithmic average or a weighted average of the first spin-lattice relaxation time constant ($T_{1,LM}(\vartheta_1)$); and
    determining the viscosity ($\eta(\vartheta_1)$) of the medium at the first temperature ($\vartheta_1$) from the logarithmic average or the weighted average of the first spin-lattice relaxation time constant using the first formula $$T_{1,LM}(\vartheta_1) \approx k_1(\eta(\vartheta_1))^{-k_2} + k_3(\eta(\vartheta_1))^{k_4};$$

wherein $0.37831 \leq k_1 \leq 3.3887$, $0.45419 \leq k_2 \leq 1.2055$, $00.88616 \cdot 10^{-3} \leq k_3 \leq 26.547 \cdot 10^{-3}$, and $-0.023116 \leq k_4 \leq 0.34519$.

3. The method according to claim 1, wherein the first spin-spin relaxation time constant ($T_2(\vartheta_1)$) of the medium at the first temperature ($\vartheta_1$) is determined as the at least one property;
    wherein the method further comprises:
    determining a logarithmic average or a weighted average of the first spin-spin relaxation time constant ($T_{2,LM}(\vartheta_1)$); and
    determining the viscosity ($\eta(\vartheta_1)$) of the medium at the first temperature ($\vartheta_1$) from the logarithmic average or the weighted average of the first spin-spin relaxation time constant using the second formula $$T_{2,LM}(\vartheta_1) \approx k_5(\eta(\vartheta_1))^{-k_6};$$

wherein $0.37831 \leq k_5 \leq 3.3887$ and $0.45419 \leq k_6 \leq 1.2055$.

4. The method according to claim 1, wherein the first diffusion time constant ($D(\vartheta 1)$) of the medium at the first temperature ($\vartheta 1$) is determined as the first property;
    wherein the method further comprises determining the viscosity ($\eta(\vartheta 1)$) of the medium at the first temperature ($\vartheta 1$) from the diffusion time constant using the third formula $$D(\vartheta_1) = k_7 \eta(\vartheta_1)^{k_8};$$

wherein $0.2445 \cdot 10^{-9} \leq k_7 \leq 2.2005 \cdot 10^{-9}$ and $0.375 \leq k_8 \leq 0.650$
    when the first diffusion time constant ($D(\vartheta_1)$) of the medium at the first temperature ($\vartheta_1$) is less than or equal to $3 \cdot 10^{-11}$ m$^2$/s; and
    wherein $0.05777 \cdot 10^{-9} \leq k_7 \leq 0.5199 \cdot 10^{-9}$ and $0.125 \leq k_8 \leq 0.375$
    when the first diffusion time constant ($D(\vartheta_1)$) of the medium at the first temperature ($\vartheta_1$) is greater than $3 \cdot 10^{-11}$ m$^2$/s.

5. The method according to claim 1 further comprising determining at least one relaxation time constant ($T_i(\vartheta_2)$, $i=\{1,2\}$) of the medium at the second temperature ($\vartheta_2$) from at least one of the second spin-lattice relaxation time constant ($T_1(\vartheta_2)$) and the second spin-spin relaxation time constant ($T_2(\vartheta_2)$) using a temperature coefficient ($dT_i/d\vartheta$) of a relaxation time constant ($T_i$) from at least one of the second spin-lattice relaxation time constant ($T_1(\vartheta_2)$) and the second spin-spin relaxation time constant ($T_2(\vartheta_2)$).

6. The method according to claim 5, further comprising determining the at least one relaxation time constant ($T_i(\vartheta_2)$, $i=\{1,2\}$) of the medium at the second temperature ($\vartheta_2$) using the fourth formula $$T_i(\vartheta_2) = T_i(\vartheta_1) e^{\gamma \vartheta_2},$$

or using the Taylor polynomial of the fourth formula according to the fifth formula $$T_i(\vartheta_2) = T_i(\vartheta_1)[1 + \gamma(\vartheta_2 - \vartheta_1) + \ldots],$$

or using the approximation formula of the fourth formula, according to the sixth formula $$T_i(\vartheta_2) \approx T_i(\vartheta_1) + \frac{dT_i}{d\vartheta}(\vartheta_2 - \vartheta_1),$$

which uses the seventh formula $$\gamma = \frac{1}{T_i(\vartheta_1)} \frac{dT_i}{d\vartheta}$$

7. The method according to claim 5, further comprising determining the temperature coefficient ($dT_i/d\vartheta$) using the eighth formula $$\frac{dT_i}{d\vartheta} \approx k_9 e^{-k_{10}\eta};$$

wherein $0.013036 \leq k_9 \leq 0.11732$ and $1.2604 \cdot 10^{-3} \leq k_{10} \leq 5.0416 \cdot 10^{-3}$.

8. The method according to claim 7, further comprising using the viscosity ($\eta(\vartheta 1)$) of the medium at the first temperature ($\vartheta 1$).

9. The method according to claim 5, further comprising determining the second spin-lattice relaxation time constant ($T_1(\vartheta_2)$) at the second temperature ($\vartheta_2$) of the medium:
determining a logarithmic average or a weighted average of the second spin-lattice relaxation time constant ($T_{1,LM}(\vartheta_2)$); and
determining the viscosity ($\eta(\vartheta_2)$) of the medium at the second temperature ($\vartheta_2$) from the logarithmic average or the weighted average of the second spin-lattice relaxation time constant ($T_{1,LM}(\vartheta_2)$) using the first formula.

10. The method according to claim 9, further comprising determining the second diffusion time constant ($D(\vartheta_2)$) of the medium at the second temperature ($\vartheta_2$) from the viscosity ($\eta(\vartheta_2)$) of the medium at the second temperature ($\vartheta_2$) using the third formula.

11. The method according to claim 5, further comprising:
determining the second spin-spin relaxation time constant ($T_2(\vartheta_2)$) at the second temperature ($\vartheta_2$) of the medium:
determining a logarithmic average or a weighted average of the second spin-spin relaxation time constant ($T_{2,LM}(\vartheta_2)$); and
determining the viscosity ($\eta(\vartheta_2)$) of the medium at the second temperature ($\vartheta_2$) from the logarithmic average or the weighted average of the second spin-spin relaxation time constant ($T_{2,LM}(\vartheta_2)$) using the second formula.

12. The method according to claim 5, further comprising:
flowing the medium with the second temperature ($\vartheta_2$) through the measuring volume;
carrying out nuclear magnetic measurements on the medium with the second temperature ($\vartheta_2$) in the measuring volume; and
determining a flow of the medium with the second temperature ($\vartheta_2$) using the nuclear magnetic measurements, the second spin-lattice relaxation time constant ($T_1(\vartheta_2)$) and/or the second spin-spin relaxation time constant ($T_2(\vartheta_2)$) of the medium (5) at the second temperature ($\vartheta_2$).

13. The method according to claim 12, further comprising converting the flow of the medium with the second temperature ($\vartheta_2$) to a flow of the medium at the first temperature ($\vartheta_1$) or a further temperature ($\vartheta_3$).

14. The method according to claim 13, further comprising using the density ($\rho$) and/or the viscosity ($\eta$) of the medium for the conversion.

15. The method according to claim 1, further comprising determining a density ($\rho$) of the medium from the viscosity ($\eta$) of the medium.

16. The method according to claim 15, wherein the density ($\rho$) is determined from the viscosity using the formula $$\rho \approx k_{11} - \frac{k_{12}}{\eta^{k_{13}}};$$

wherein $941.82 \leq k_{11} \leq 1025.8$, $180.65 \leq k_{12} \leq 264.61$, and $0.15921 \leq k_{13} \leq 0.37899$.

17. A non-transitory computer program product including instructions which, when the program is executed by a computer, cause the computer to execute the method according to claim 1.

18. A nuclear magnetic flowmeter, comprising:
a measuring tube having a measuring volume;
a measuring device designed to carry out nuclear magnetic measurements; and
a computer designed to carry out a method including the following steps:
carrying out nuclear magnetic measurements on a medium with the first temperature ($\vartheta 1$) in the measuring volume;
determining at least one property of the medium at the first temperature ($\vartheta 1$) from the nuclear magnetic measurements, the at least one property being at least one of a first spin-lattice relaxation time constant ($T1(\vartheta 1)$) a first spin-spin relaxation time constant ($T2(\vartheta 1)$), and a first diffusion time constant ($D(\vartheta 1)$);
determining a viscosity ($\eta(\vartheta 1)$) of the medium at the first temperature ($\vartheta 1$) from the at least one property; and
determining at least one derived property of the medium at a second temperature ($\vartheta 2$) using the at least one property of the medium at the first temperature ($\vartheta 1$), the viscosity ($\eta(\vartheta 1)$) of the medium at the first temperature, the first temperature ($\vartheta 1$) and the second temperature ($\vartheta 2$), the at least one derived property being at least one of a second spin-lattice relaxation time constant ($T1(\vartheta 2)$), a second spin-spin relaxation time constant ($T2(\vartheta 2)$), and a second diffusion time constant ($D(\vartheta 2)$).

19. A non-transitory computer-readable storage medium including instructions which, when the program is executed by a computer, cause the computer to execute a method including the following steps:
carrying out nuclear magnetic measurements on a medium with a first temperature ($\vartheta 1$) in a measuring volume of a measuring tube;
determining at least one property of the medium at the first temperature ($\vartheta 1$) from the nuclear magnetic measurements, the at least one property being at least one of a first spin-lattice relaxation time constant ($T1(\vartheta 1)$), a first spin-spin relaxation time constant ($T2(\vartheta 1)$), and a first diffusion time constant ($D(\vartheta 1)$);

determining a viscosity ($\eta(\vartheta 1)$) of the medium at the first temperature ($\vartheta 1$) from the at least one property; and determining at least one derived property of the medium at a second temperature ($\vartheta 2$) using the at least one property of the medium at the first temperature ($\vartheta 1$), the viscosity ($\eta(\vartheta 1)$) of the medium at the first temperature, the first temperature ($\vartheta 1$), and the second temperature ($\vartheta 2$), the at least one derived property being at least one of a second spin-lattice relaxation time constant ($T1(\vartheta 2)$), a second spin-spin relaxation time constant ($T2(\vartheta 2)$), and a second diffusion time constant ($D(\vartheta 2)$).

* * * * *